US005389010A

United States Patent [19]
Takano et al.

[11] Patent Number: 5,389,010
[45] Date of Patent: Feb. 14, 1995

[54] CONNECTOR FOR ELECTRICAL COMPONENTS

[75] Inventors: Tsunesuke Takano; Kouichi Sinzawa, both of Tokyo, Japan

[73] Assignee: Daiichi Denso Buhin Co., Ltd., Japan

[21] Appl. No.: 114,350

[22] Filed: Sep. 1, 1993

[30] Foreign Application Priority Data

Sep. 2, 1992 [JP] Japan .............................. 4-067593[U]
Nov. 16, 1992 [JP] Japan .............................. 4-084961[U]

[51] Int. Cl.⁶ .............................................. H01R 13/74
[52] U.S. Cl. ..................................... 439/565; 439/56; 439/553
[58] Field of Search ................. 439/544, 552–554, 439/565, 545, 56, 36, 621, 622, 58

[56] References Cited

U.S. PATENT DOCUMENTS

| 3,821,695 | 6/1974 | Sholer ................................ 439/621 |
| 4,389,021 | 6/1983 | Coldren ............................. 439/545 |
| 5,049,092 | 9/1991 | Takano et al. ..................... 439/553 |

FOREIGN PATENT DOCUMENTS 53-1825 1/1978 Japan .
2244391 11/1991 United Kingdom ................ 439/565

OTHER PUBLICATIONS

"Connector for Printed Circuits", IBM Technical Disclosure Bulletin, vol. 32, No. 5B, Oct. 1989, p. 316.

Primary Examiner—Gary F. Paumen
Attorney, Agent, or Firm—Nixon & Vanderhye

[57] ABSTRACT

Connectors for electrical components include a support base having an edge which defines an open space, and an electrically insulated socket member connected to the support base within the defined open space for holding and establishing electrical connection with the electrical component. The socket member includes opposed pair of side walls, an upper wall and a lower wall which collectively establish an open-ended interior space. At least one clamp connector is disposed in a rearward end of the interior space and is coupled to the socket member for receiving a terminal portion of an electrical component inserted into a forward end of the interior space so as to connect the electrical component electrically to an external circuit. Opposed pairs of separated upper and lower locking tabs are formed on either the side walls of said socket member or the support base, and project outwardly therefrom. These upper and lower locking tabs serve to connect the socket member to the support base and positionally restrain the socket member within the defied space. Preferably, the edge of the support base defines an enlarged forward space in which the electrical component is disposed, and a rearward space in which the socket member is disposed. In this regard, the support base will most preferably include inwardly projecting retaining ears disposed at a juncture between the forward and rearward spaces.

16 Claims, 17 Drawing Sheets

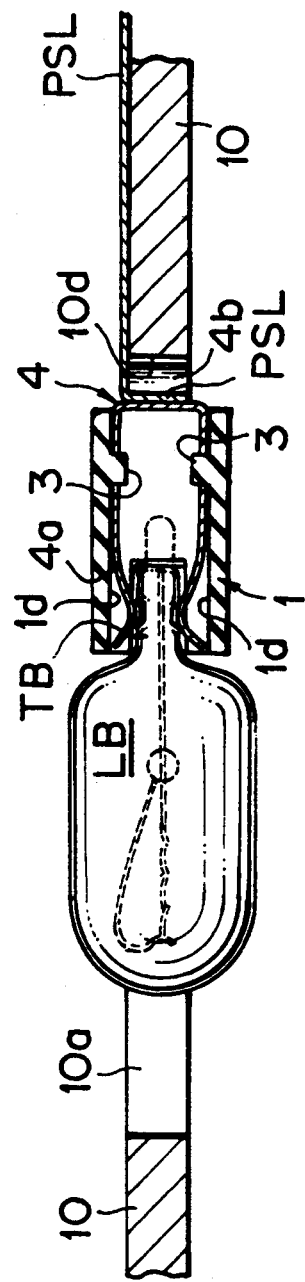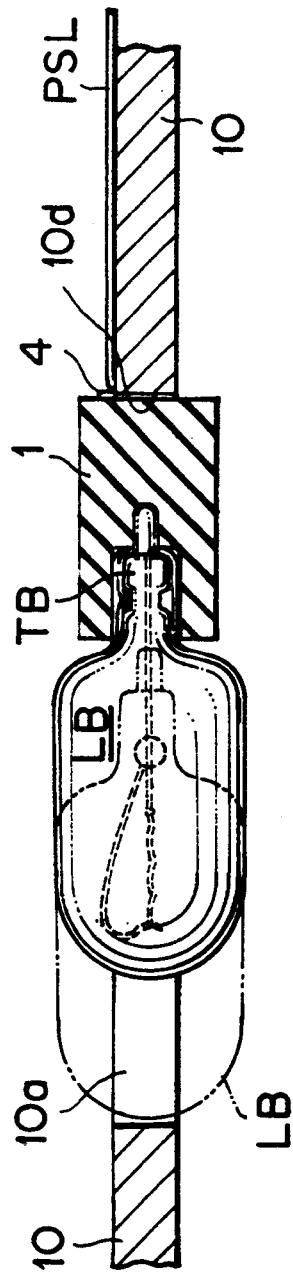

CONNECTOR FOR ELECTRICAL COMPONENTS

FIELD OF INVENTION

The present invention relates generally to connectors for electrical components, such as miniature bulbs, fuses and the like. In preferred forms, the present invention is embodied in an electrical component connector which may be assembled without tools and therefore is especially well suited for automated assembly procedures (e.g., robotics assembly).

BACKGROUND OF THE INVENTION

Connectors for electrical components are used in a variety of end-use applications. For example, in the automotive industry, connectors are employed at numerous locations in automobiles so as to positionally mount electrical components such as wedge-based miniature lamp bulbs, fuses and the like, as well as to connect such components electrically with the automobile's electrical system.

One prior connector which is employed to mount wedge-based lamp bulbs is disclosed in Japanese Utility Model Application No. 53-1825. According to this prior structure, miniature automobile lamps are equipped with a housing, a lens covering an opening in the housing and a holder attached to the housing for supporting a wedge-base bulb. The holder itself includes a body member which is formed by bending a conductive metal strip into a general U-shape, and includes an integral attachment piece which extends in a direction opposite to the U-shaped metal strip. A center piece and opposed right and left side pieces are provided at a location in relation to a concave engagement portion of the holder body such that the side pieces protrude from the top and bottom of such concave engagement portion. The U-shaped conductive metal strip is thus clamped between the center piece and the opposed right and left side pieces by insertion into the concave engagement portion. In such a state, the attachment piece of the holder body is fixed in the housing together with an electrically conductive strip for connection to the electrical power supply.

One problem attendant with the prior connector structure discussed above is that the friction fit between the wedge-base bulb and its electrical contacts may become loose due to thermal deformation of the bulb holder by virtue of the heat generated by the lamp during use. While the holder could be formed of a heat-resistant plastics material and/or a large interior housing could be employed in order to counteract such a problem, neither is a satisfactory solution. In this regard, heat-resistant plastics materials tend to be expensive and are not readily moldable, thereby resulting in increased costs. A large interior housing, on the other hand, unnecessarily increases the size of the connector.

Furthermore, the prior connector structure discussed above is relatively complex and requires post-assembly procedures such as caulking. As a result, the connector is not readily assembled completely by automated processing techniques (e.g., robotics assembly).

What has been needed, therefore, is a reliable and inexpensive heat-resistant structure for attaching electrical components such as wedge-based bulbs, fuses and the like to a non-heat-resistant substrate member by means of a heat-resistant holder so as to facilitate assembly of the connector to the substrate member by automated techniques. It is towards providing such a connector that the present invention is directed.

SUMMARY OF THE INVENTION

The electrical component connector according to the present invention generally includes a support base (which is preferably a rigid, substantially planar structure) having an edge defining and bounding an open space. An electrically insulated socket member is connected to the support base within the defined open space for holding and establishing electrical connection with the electrical component. The socket member includes an opposed pair of side walls, an upper wall and a lower wall which collectively establish an open-ended interior space. At least one clamp connector (more preferably a pair of clamp connectors) is disposed in a rearward end of the interior space and is coupled to the socket member for receiving a terminal portion of an electrical component inserted into a forward end of the interior space so as to connect the electrical component electrically to an external circuit.

Opposed pairs of separated upper and lower locking tabs are formed on either the side walls of said socket member or the support base, and project outwardly from such respective structures. These upper and lower locking tabs serve to connect the socket member to the support base and positionally restrain the socket member within the defied space. Preferably, the edge of the support base defines an enlarged forward space in which the electrical component is disposed, and a rearward space in which the socket member is disposed. In this regard, the support base will most preferably include inwardly projecting retaining ears disposed at a juncture between the forward and rearward spaces so as to restrain the socket member from movement in longitudinal directions (i.e., so as to prevent its being dislodged longitudinally from the rearward space defined by the support base).

These and other advantages will become more clear after careful consideration is given to the detailed description of the preferred exemplary embodiments which follow.

BRIEF DESCRIPTION OF THE DRAWINGS

Reference will hereinafter be made to the accompanying drawings wherein like reference numerals throughout the various FIGURES denote like structural elements, and wherein.

FIG. 3 is a cross-sectional elevation view of the assembled connector depicted in FIG. 2 as taken along line 3—3 therein;

FIG. 4 is another cross-sectional elevation view of the assembled connector depicted in FIG. 2, but taken along line 4—4 therein;

DETAILED DESCRIPTION OF THE PREFERRED EMBODIMENTS

Figure 1:
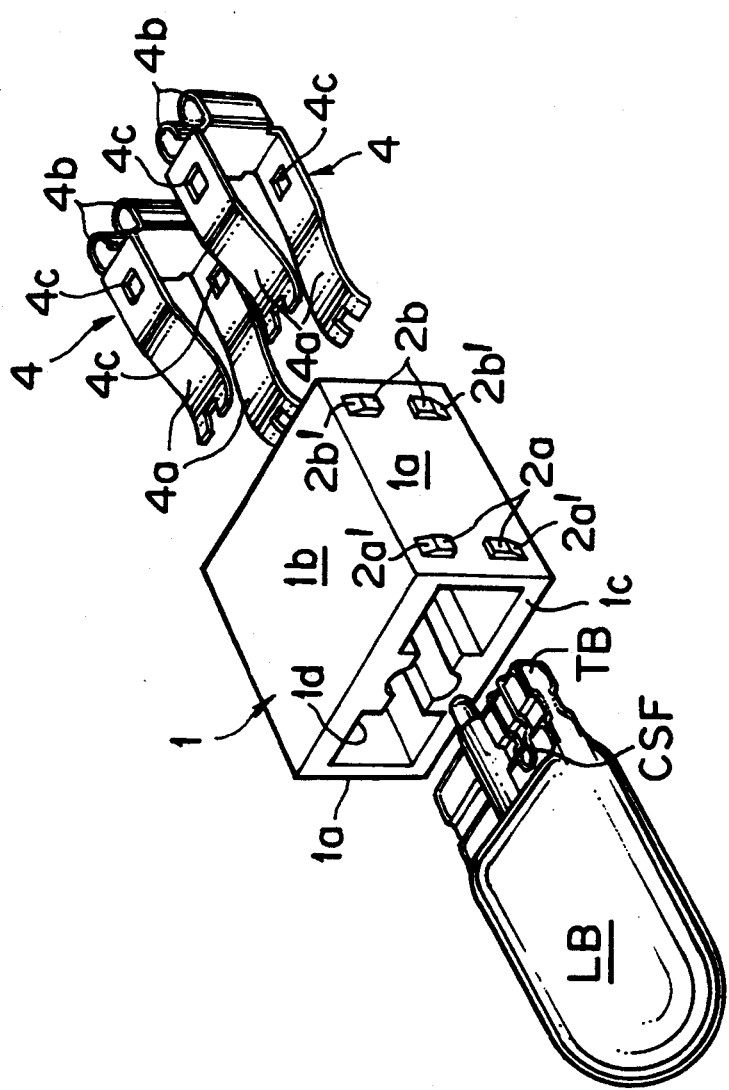
FIG. 1 is an exploded perspective view of a connector for a wedge-base lamp bulb according to the present invention.
Figure 2:
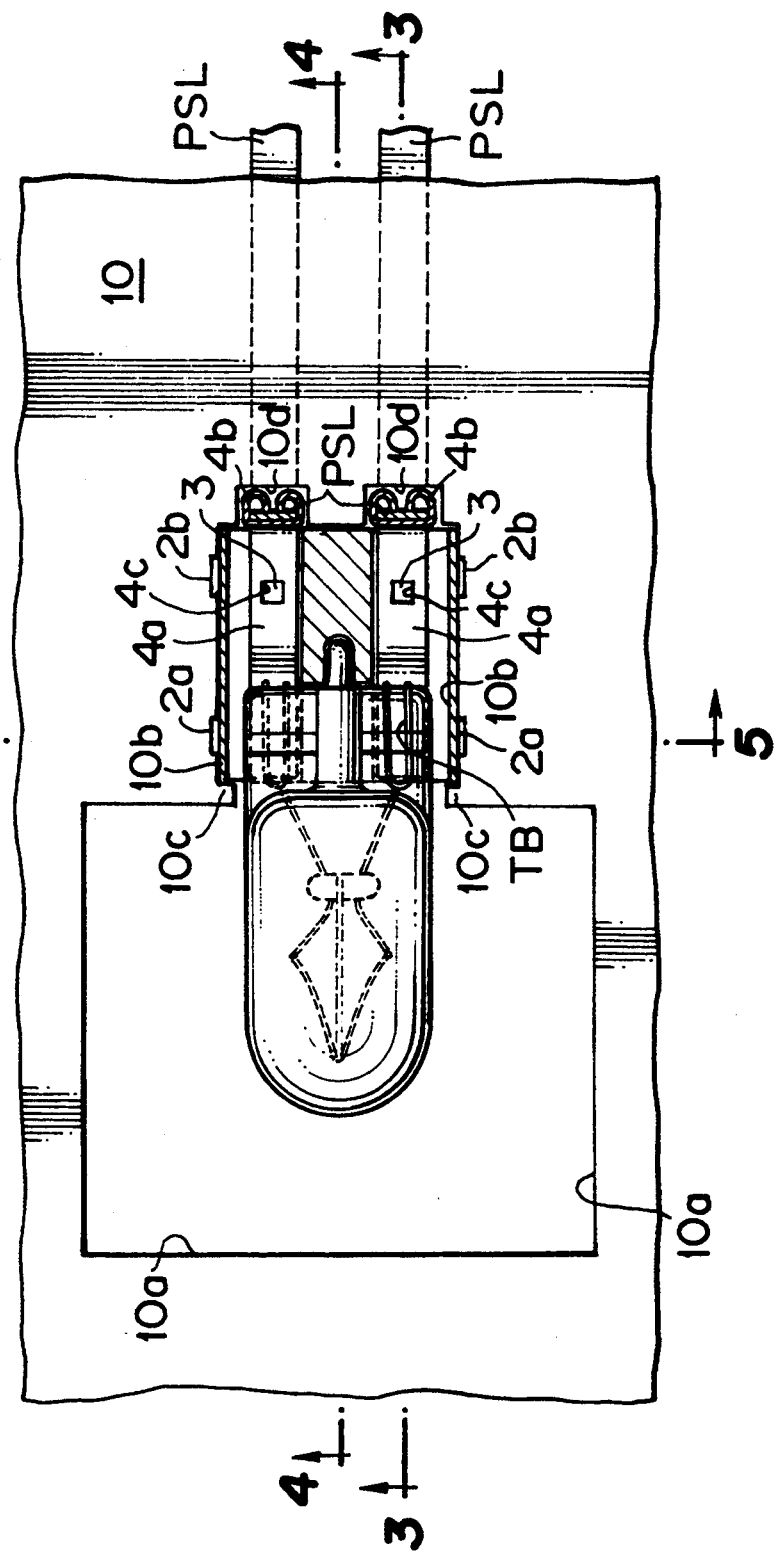
FIG. 2 is a top plan view showing the connector depicted in FIG. 1 assembled with a support base.
Figure 5:
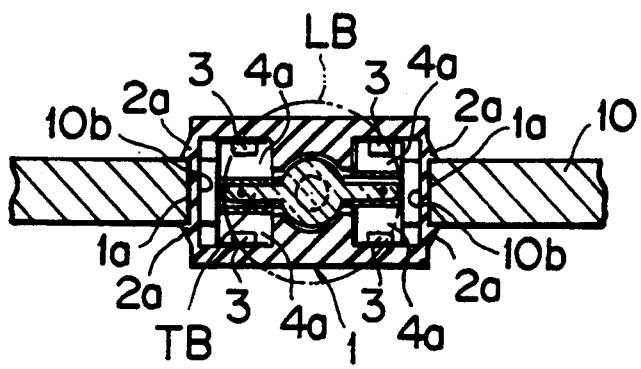
FIG. 5 is another cross-sectional elevation view of the assembled connector depicted in FIG. 2, but taken along line 5—5 therein.
Figure 6:
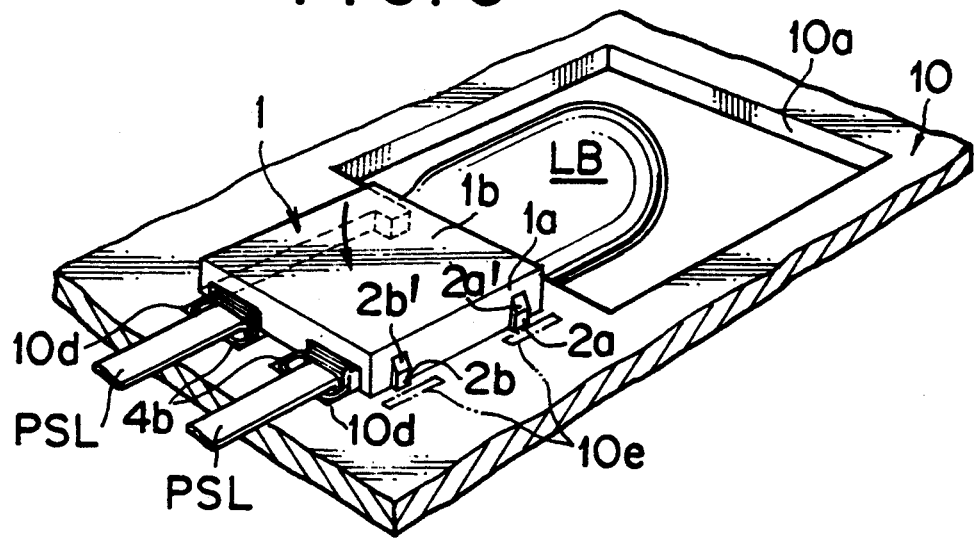
FIG. 6 is a further perspective view of the connector depicted in FIG. 2, but viewed from the rear end thereof.

One particularly preferred form of the connector according to this invention is shown in accompanying FIGS. 1–6. As shown therein, the connector is generally comprised of an open-ended, electrically insulating socket member 1 having an opposed pair of side walls 1a, an upper wall 1b and a lower wall 1c which collectively define an interior space 1d sized and configured to accept the terminal base of an electrical component, which in the particular case shown in the drawing FIGURES, is a wedge-base lamp bulb LB. The connector according to this invention, however, can suitably be configured so as to accommodate other electrical components, for example, electrical fuses.

The socket member 1 includes fore and aft pairs of locking tabs 2a and 2b, respectively, on each of its side walls 1a. Each of the tabs 2a, 2b is most preferably provided with a ramp surface 2a', 2b', respectively, the purpose of which will be discussed in greater detail below. The interior surfaces of the upper and lower walls 1b and 1c are each provide with outwardly projecting locking bosses 3, respectively (see FIGS. 2 and 3).

A pair of component clamp connectors 4 are provided so as to frictionally engage the terminal base TB of the lamp bulb LB. In this regard, each of the clamp connectors 4 are provided with an opposed pair of resilient clamp fingers 4a which serve to make electrical contact with the terminal base TB, and particularly the contact spring filament CSF of the lamp bulb LB. The clamp connectors 4 are also provided at their rearward end with opposed, inwardly curled terminal lugs 4b which serve to couple the clamp connectors 4 to a terminal portion PSL' of power supply lead PSL associated with the electrical circuitry (see FIG. 6). Each of the clamp fingers 4a defines an aperture 4c which is sized so as to accept therewithin a respective one of the interior lock bosses 3. Thus, when the clamp connectors 4 are each inserted into the open rear end of the socket member 1, the clamp fingers 4a will be resiliently displaced until the lock bosses 3 are register with a respective one of the apertures 4c. As a result, the clamp fingers 4a will return to their normal condition such that the lock bosses 3 will extend through their respective aperture 4c and thereby positionally lock the clamp connectors within the socket member 1. The lamp bulb LB may then be inserted into engagement between the clamping fingers 4a by inserting the terminal base TB into the open forward end of the socket member 1.

Once the lamp bulb LB and the clamp connectors 4 have been positioned within the socket member 1 as described above, the assembly may then be coupled to the rigid support base 10 (usually in the form of a rigid plate-like member having a thickness dimension substantially less than the dimension between the top and bottom walls 1b, 1c of the socket member 1). The support base 10 defines a forward and rearward open spaces 10a, 10b. The rearward open space 10b is sized sufficiently so as to accommodate the socket member 1, whereas the forward open space 10a is enlarged (as compared to the rearward space 10b) so as to allow full length longitudinal movement of the lamp bulb LB away from the socket member 1 for purposes of replacement (see FIG. 4). Opposed retaining ears 10c are formed on the edge of the support base 10 at the juncture of the forward and rearward spaces 10a, 10b so as to restrain the socket member 1 against forward movement when the socket member 1 is coupled to the support base 10. A pair of access spaces 10d are also defined by the support substrate rearwardly of the rearward space 10b so as to accommodate the terminal lugs 4b.

To assemble the connector according to the embodiment shown in FIGS. 1–6, the clamp connectors 4 may first be inserted into the open rear end of the socket member 1 until they are each positionally locked by means of the interaction between the interior lock bosses 3 and apertures 4c. Although not necessary, the lamp bulb LB may then be inserted into clamp relationship with the clamp fingers 4a as described previously. At this time, the subassembly may then be coupled to the support base 10 by forcibly inserting the socket member 1 into the rearward space 10b. In this regard, during insertion, the lowermost ones of the ramp surfaces 2a will come into contact with a corresponding edge portion forming the rearward space 10b. As a result, a beneficial "camming" action will occur which causes the side walls 1a to be displaced resiliently inwardly until the lowermost locking tabs in the locking tab pairs 2a, 2b clears the edge of the support base defining the rearward space 10b. At such time, the side walls 1 a will then resiliently return outwardly so that the edge of the support base 10 defining the rearward space 10b is captured between the lock tabs of each lock tab pair 2a, 2b. Once this "snap-action" has occurred, the socket member will be positively coupled to the support base 10 due to the support base 10 being captured between the locking tab pairs 2a, 2b, and due to the presence of the restraining ears 10c. Thereafter, the bent terminal leads TL of the power supply leads PSL may then be inserted into the lugs 4b to connect the lamp bulb LB to the electrical circuit.

In order to further facilitate insertion of the socket member 1 into the rearward space of the support base 10, relatively narrow slits 10e may be formed in the support base 10 adjacent to the location of the lock tab pairs 2a, 2b. In such a manner, a relatively thin "bridge" will be formed which may then be outwardly displaced relative to the socket member 1 (i.e., into the space provided by the respective silt 10e). The combination of resilient inward displacement of the socket member side walls 1a and resilient outward displacement of the bridge material formed by the slits 10e will thus facilitate insertion of the socket member 1 into the rearward space 10c.

Figure 7:
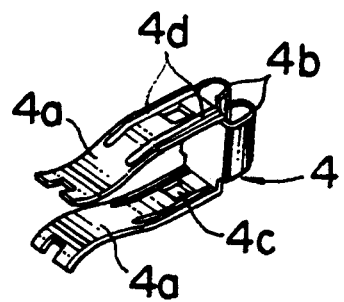
FIG. 7 is a perspective view of another form of a clamp connector that may be employed with the connector depicted in FIGS. 1-6.

An alternative form of the clamp connectors 4 which may be employed in the embodiment of the connector described above is shown in accompanying FIG. 7. In this regard, the clamp connector 4' shown in FIG. 7 is structurally identical to the clamp connector 4 discussed above except that each of the clamp fingers 4a is formed with a longitudinally extending pair of ribs 4d. These pairs of ribs 4d thus serve as spaces against the top and bottom walls 1b, 1c, respectively, of the socket member 1 to define a vent path through the socket member 1. As such, undesirable heat build-up within the socket member 1 may be minimized.

Figure 8:
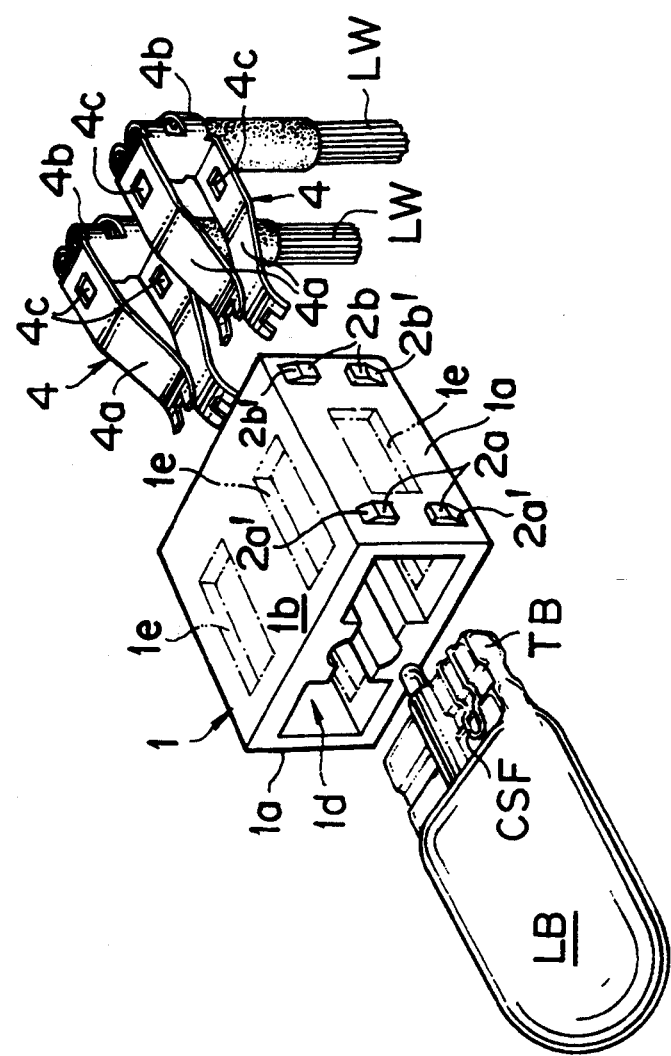
FIG. 8 is an exploded perspective view of another embodiment of a socket member that may be employed in the connectors of this invention.

The connector embodiment shown in FIG. 8 is substantially similar to the connector embodiment shown above, except that the base member 1 is provided with one or more windows 1e (shown in phantom line in FIG. 8) so as to facilitate venting and heat transfer from the interior 1d of the socket member 1. Furthermore, the connector embodiment shown in FIG. 8 shows an alternative electrical connection in the form of upwardly extending lead wires LW having their ends electrically coupled to the terminal lugs 4b.

Figure 9:
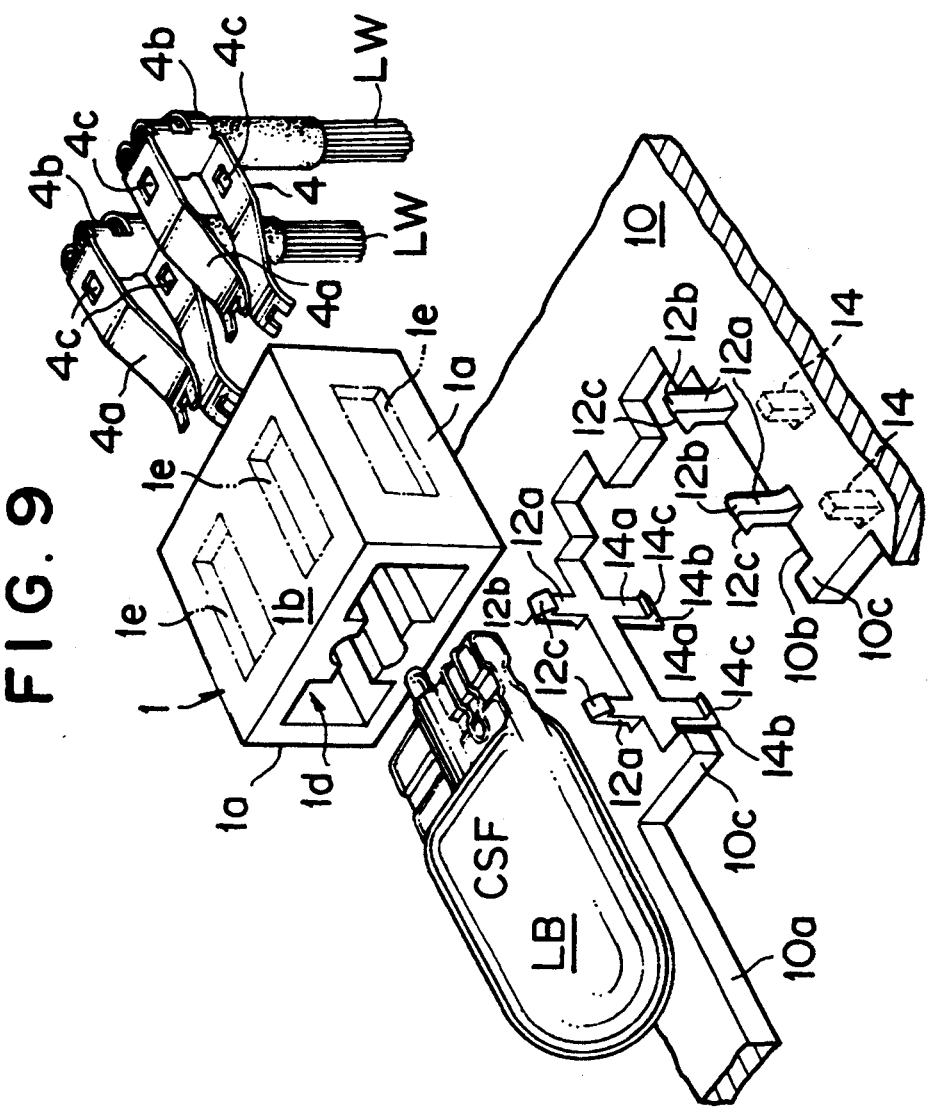
FIG. 9 is an exploded perspective view of a connector for a wedge-base lamp bulb according to yet another embodiment of the present invention.

FIG. 9 shows an alternative embodiment of the connector according to this invention. As can be seen, no locking tabs are provided as an integral part of the socket member 1. Instead, upwardly and downwardly extending lock tabs 12, 14, respectively, are provided as an integral part of the support base 10 adjacent the rearward space 10b. These lock tabs 12, 14 are each formed with a post 12a, 14a which includes at its terminal end a tab element 12b, 14b, respectively. Moreover, these tab elements 12b, 14b include a ramp surface so as to facilitate coupling with the socket member 1. In this regard, it will be understood that, when the socket member 1 is forcibly pressed into the rearward space 10b, the ramp surfaces will cause the posts 12a (assuming that the socket member is inserted from above, but posts 14a if the socket member is inserted from below) to be outwardly displaced. When the socket member 1 is in position, the posts 12a (or 14a) will then resiliently return to their upright position, at which time the tab elements 12b will engage the upper wall 1b of the socket member 1. As such, the socket member 1 will be positionally locked between the pairs of tab elements 12b, 14b.

Figure 10:
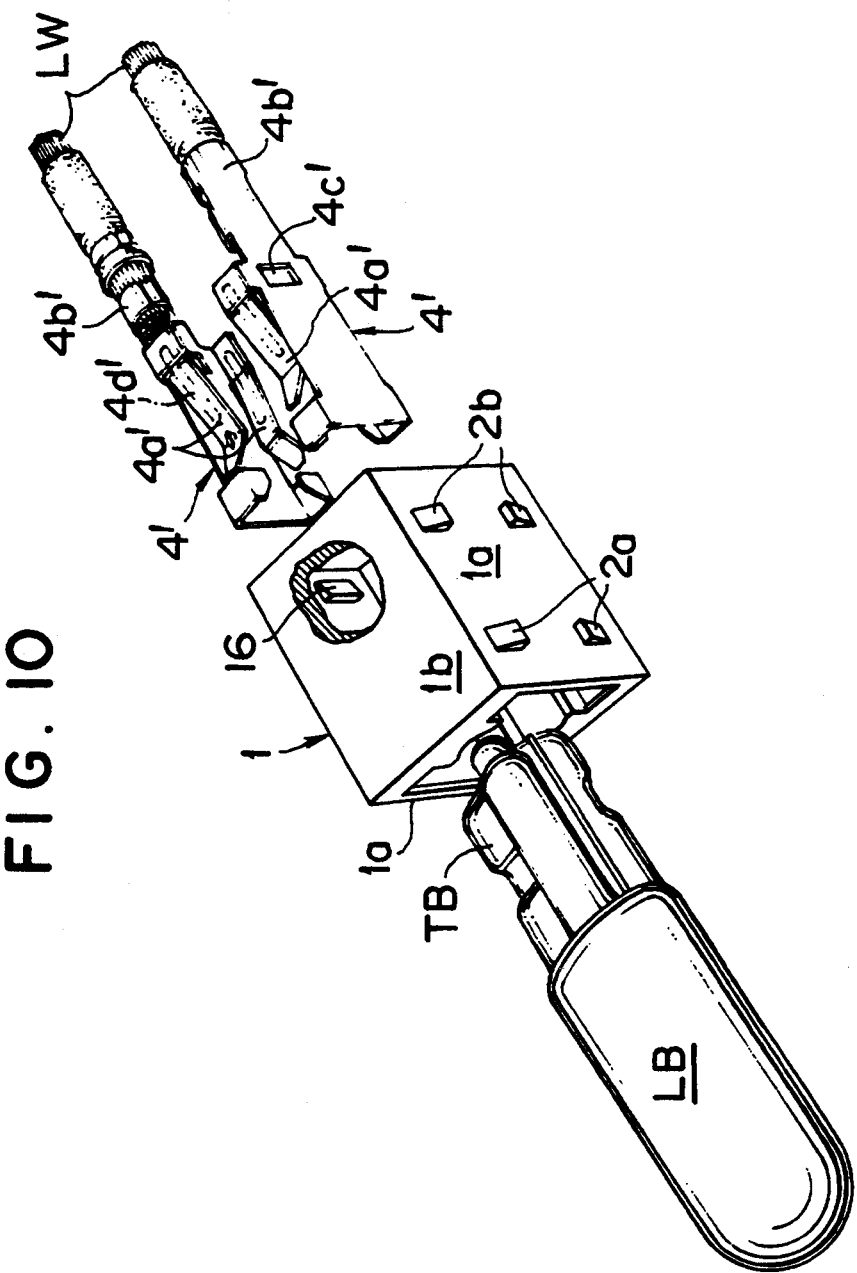
FIG. 10 is an exploded perspective view of a connector for a wedge-base lamp bulb according to yet another embodiment of the present invention.

The socket member 1 shown in FIG. 10 is provided with interior engagement tabs 16 (only one such engagement tab 16 being visible) formed on the interior of side walls 1a. These engagement tabs 16 mate with a respective aperture 4c' formed in the side of lateral clamp connectors 4'. In this regard, the engagement tabs 16 are each inclined in the insertion direction of the clamp connectors 4' (i.e., inclined in a direction from the rear end toward the front end of the socket member 1). The clamp connectors 4' include a pair of clamp fingers 4a' which may be provided with ribs (shown in phantom line by reference numerals 4d') so as to provide a vent means to allow escape of heat through the socket member 1. The clamp connectors 4' are likewise provided with terminal lugs 4b' so as to accept and connect with lead wires LW.

Figure 11:
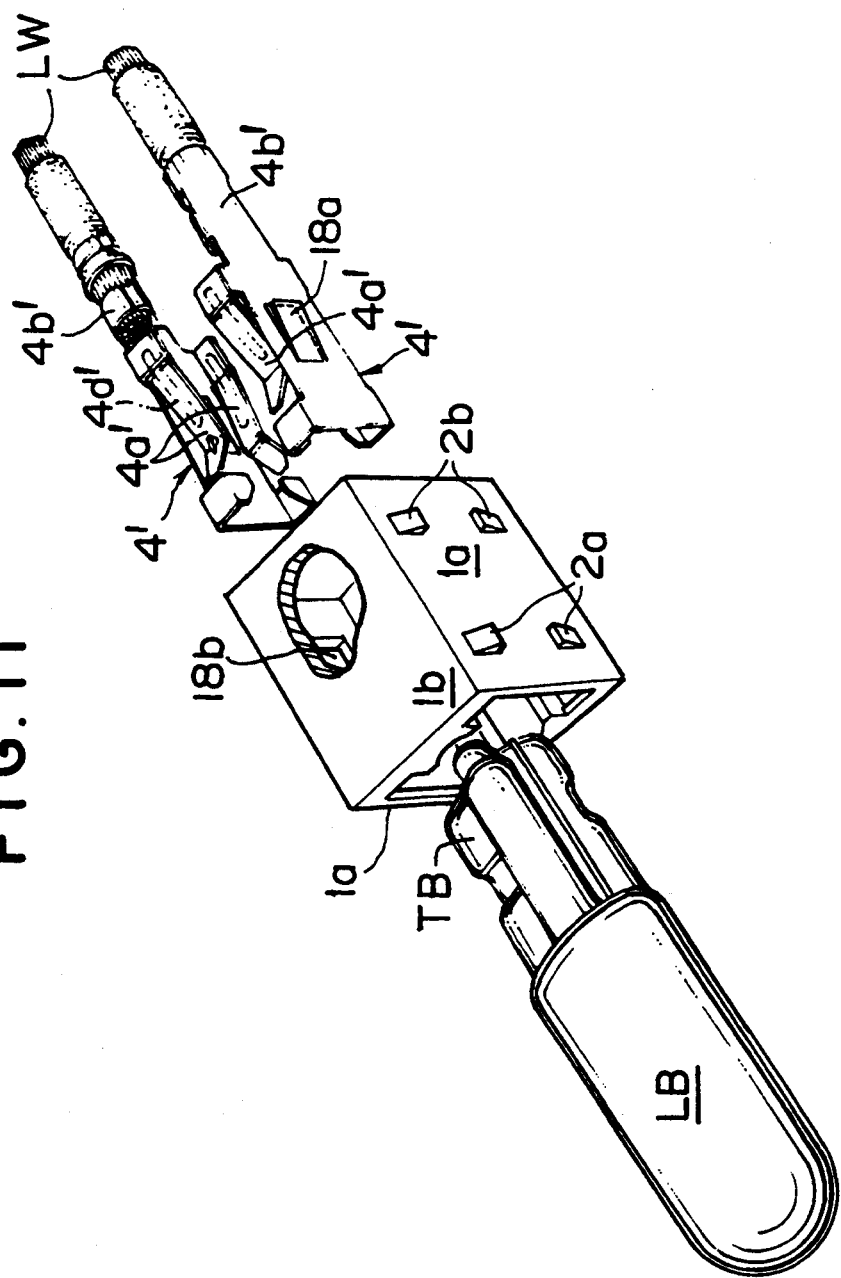
FIG. 11 is an exploded perspective view of a further embodiment of the connector according to this invention which is similar to the embodiment depicted in FIG. 10, but utilizing somewhat different clamp connectors.

The connector shown in FIG. 11 is substantially the same as that described above with reference to FIG. 10, except that the clamp connectors 4' are provided with an inclined spring tab 18, which seats within a corresponding recess 18b (only one such recess 18b being visible) formed in the interior surface of the side wall 1a of socket member 1. Thus, when inserting the clamp connectors 4' shown in FIG. 11, the spring tabs 18a will be pressed inwardly until they are in registry with a respective one of the recesses 18b, at which time they will each resiliently extend into the recess thereby locking the clamp connectors 4' in place.

Figure 12:
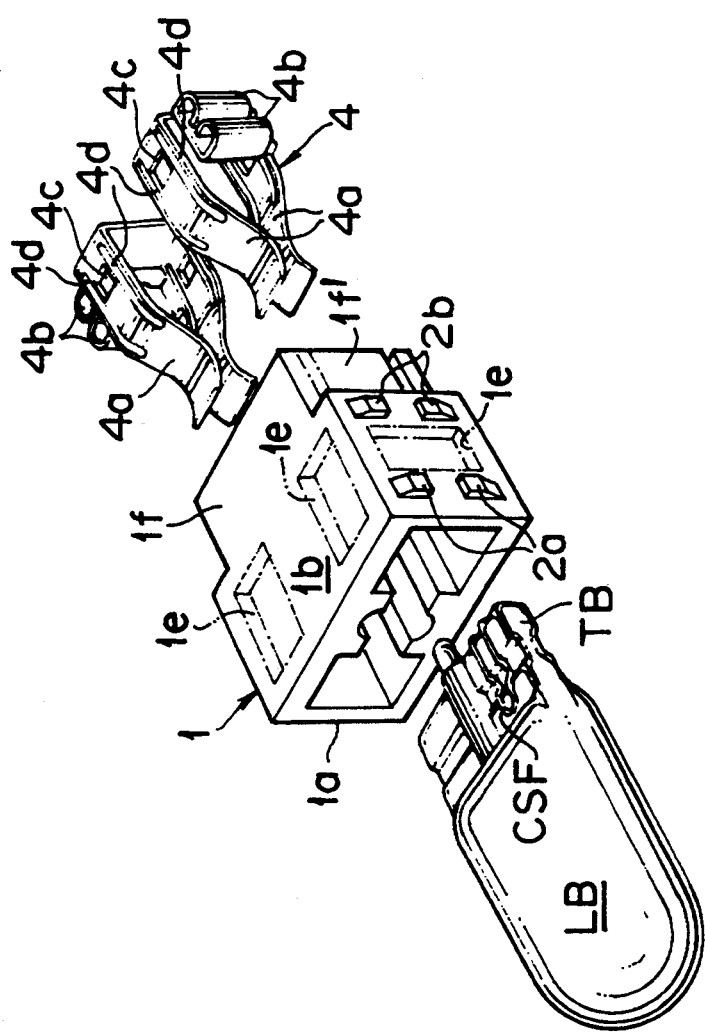
FIG. 12 is an exploded perspective view of a connector for a wedge-base lamp bulb according to yet another embodiment of the present invention.

The socket member 1 shown in FIG. 12 is a slightly modified version of that shown in FIG. 1 in that it is generally T-shaped. That is, the socket member 1 shown in FIG. 12 includes a relatively narrow tail portion 1f having sides 1f' which are inwardly offset relative to the side walls 1a. As such, the terminal lugs 4b, which are disposed laterally of the finger clamps 4a are positioned adjacent the sides 1f in the recessed space formed with side walls 1a. The dimension between the laterally disposed terminal lugs 4b and the clamp fingers 4a is, moreover, provided so that a respective side 1f is tightly inserted therebetween to further assist in positionally retaining the clamp connector 4 within the socket member 1.

Figure 13:
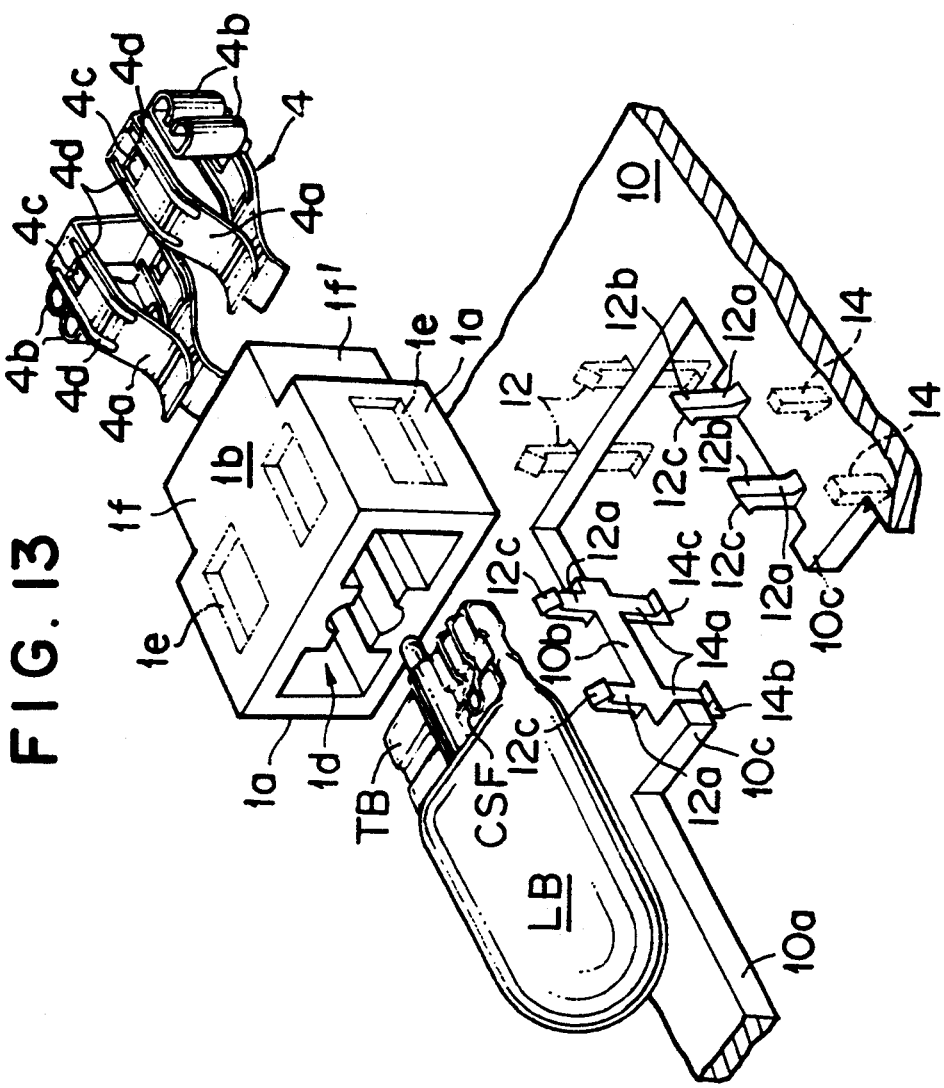
FIG. 13 is an exploded perspective view of another embodiment of a connector according to this invention.

The embodiment depicted in FIG. 13 is substantially similar to that described above with reference to FIG. 12, with the principal exception being that the support base 10 includes paired locking tabs 12, 14 (e.g., similar to FIG. 9). Furthermore, it will be observed that additional pairs of locking tabs 12, 14 may optionally be provided to engage the rearward end of the tail 1f of the socket member 1.

Figure 14:
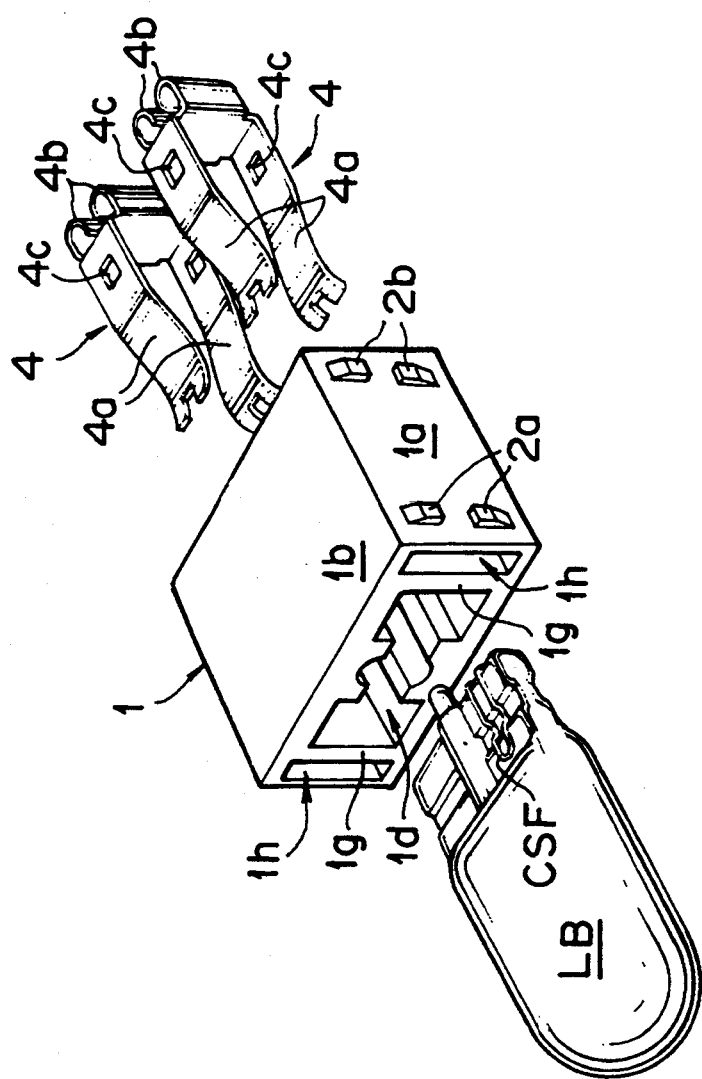
FIG. 14 is an exploded perspective view of a connector for a wedge-base lamp bulb according to yet another embodiment of the present invention.

The socket member 1 shown in FIG. 14 is substantially similar to that depicted in FIG. 1, with the principle exception being that interior side walls 1g are positioned in parallel spaced relationship to the exterior side walls 1a so as to establish an open channel 1h extending the lengthwise direction of the socket member 1 between the open front and rear ends. The interior side walls 1g enhance the structural integrity of the socket member 1 with detrimentally affecting of interfering with the resiliency of the exterior side walls 1a so that the walls 1a may flex upon insertion of the socket member 1 into the support base 10. Also, the channel 1h defined between the interior and exterior side walls 1a and 1g, respectively, allows heat to be vented through the socket member 1.

Figure 15:
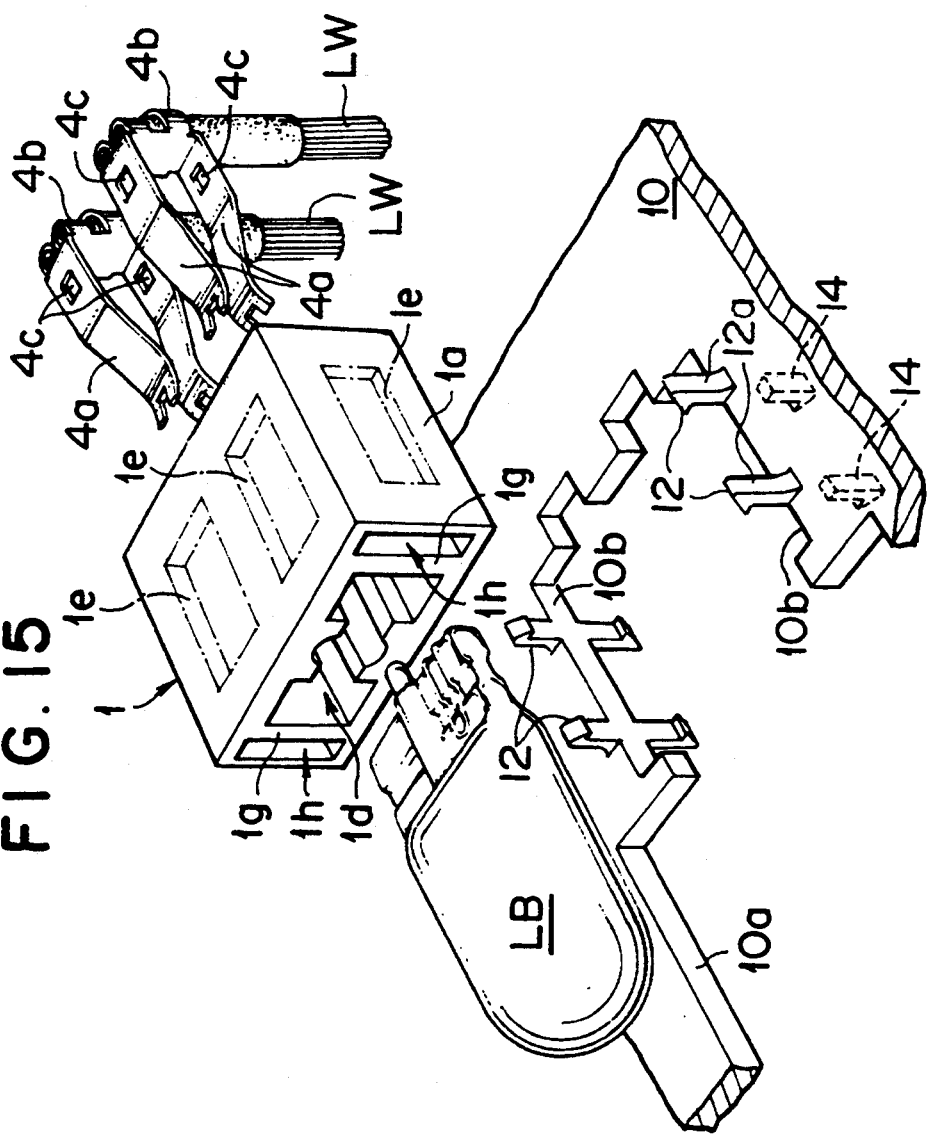
FIG. 15 is an exploded perspective view of another embodiment of a connector according to this invention which is somewhat similar to the embodiment depicted in FIG. 9.

The embodiment shown in FIG. 15 is similar to that depicted in FIG. 14, but has the locking tab pairs 12, 14 formed as a part of the support base 10.

Figure 16:
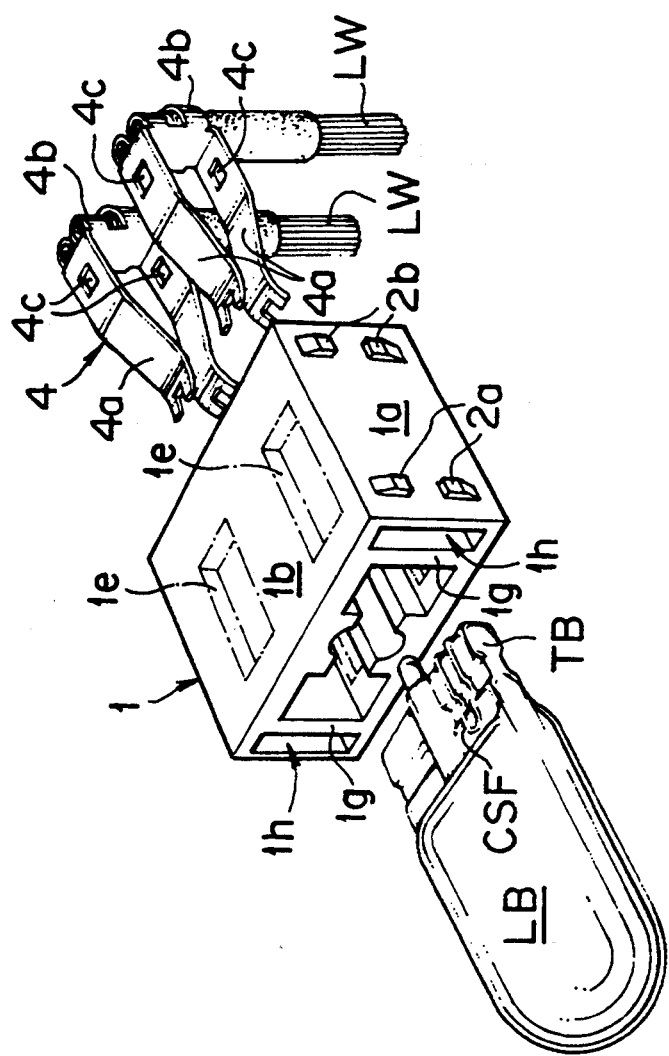
FIG. 16, 17 and 18 essentially represent a combination of those features shown in FIG. 8 with each of FIGS. 14, 10 and 11, respectively.
Figure 17:
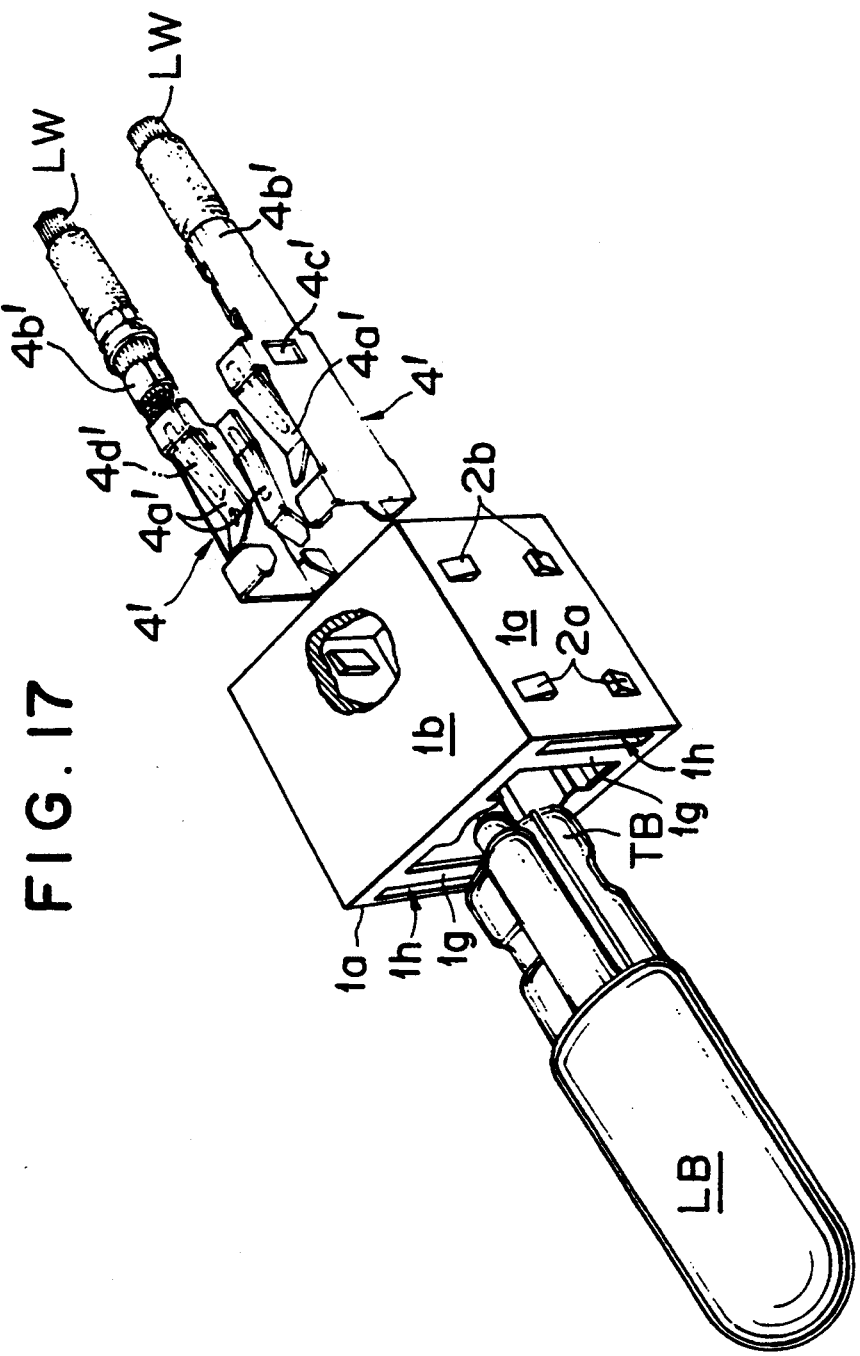
Figure 18:
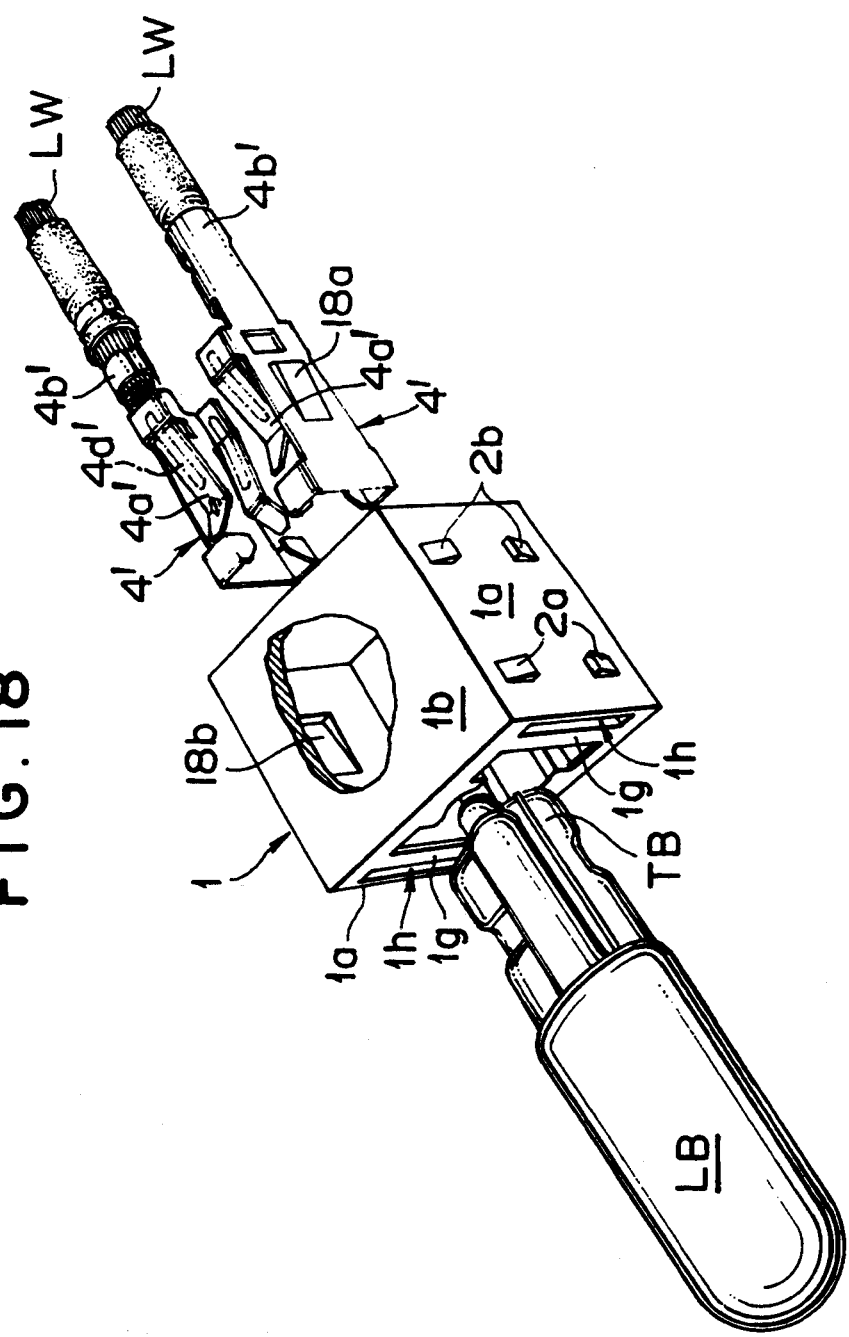

The embodiments shown in FIG. 16, 17 and 18 essentially represent a combination of those features shown in FIG. 8 with each of FIGS. 14, 10 and 11, respectively.

Figure 19:
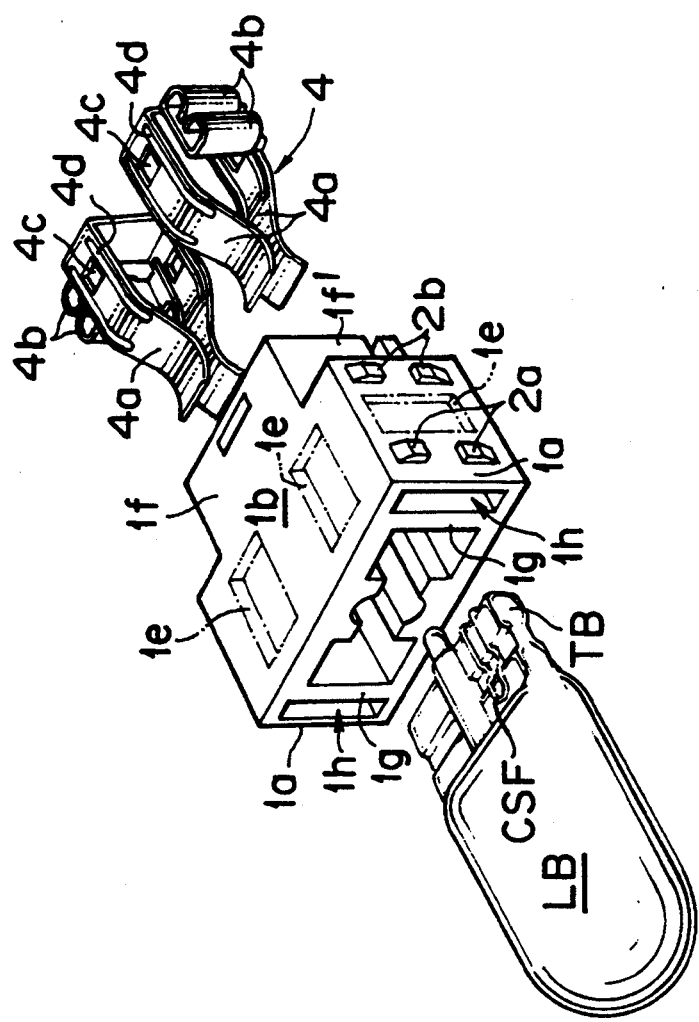
FIGS. 19 and 20 essentially represent a combination of those features shown in FIG. 12 and 13, respectively.
Figure 20:
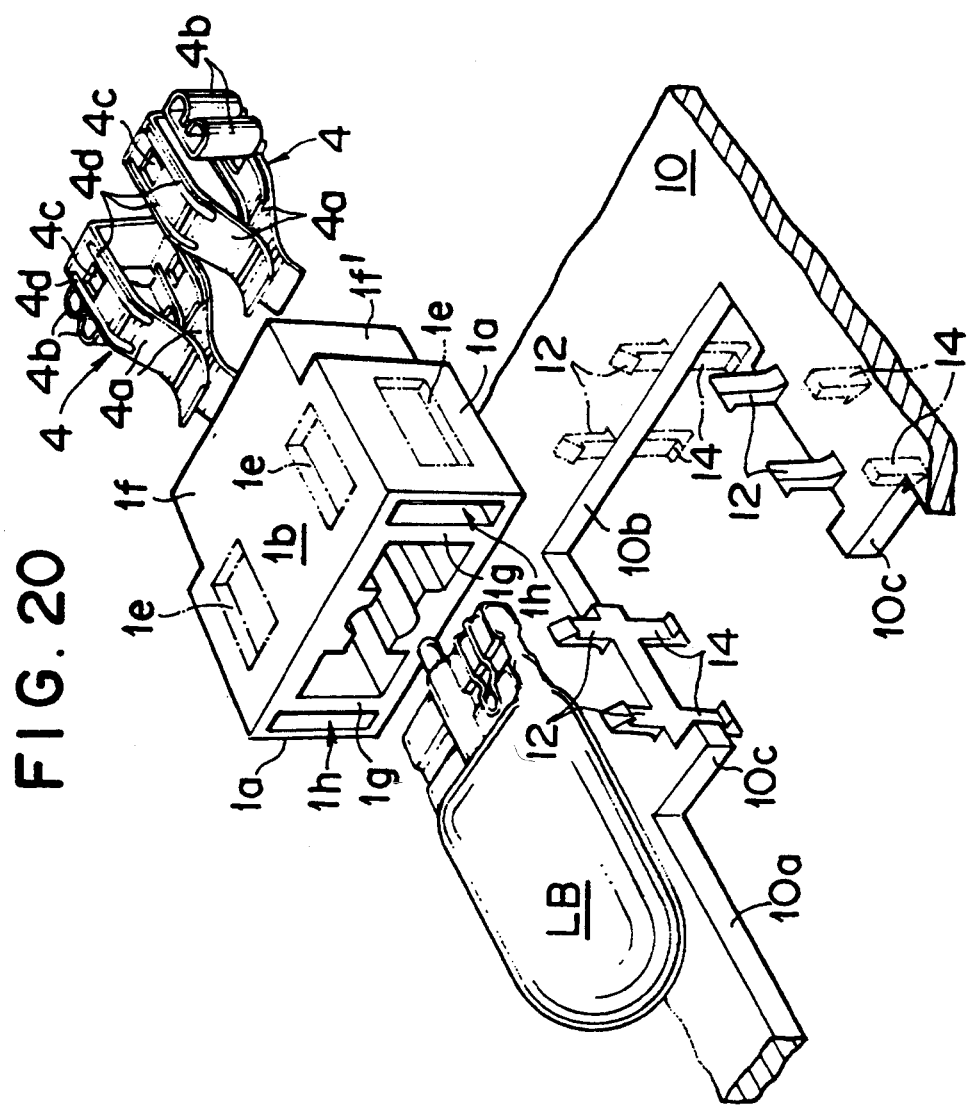

The embodiments shown in FIGS. 19 and 20 essentially represent a combination of those features shown in FIG. 12 and 13, respectively.

While the present invention has been described in terms of the most preferred embodiments, those skilled in this art will recognize that various modifications may be made thereto, which modifications are to be encompassed within the scope of the following claims.

What is claimed is:

1. A connector for an electrical component comprising:
   a support base which includes an edge defining an open space; and
   an electrically insulative socket member connected to said support base within said open space for holding and establishing electrical connection with the electrical component; wherein
   said socket member includes an opposed pair of side walls, an upper wall and a lower wall which collectively establish an open-ended interior space;
   at least one clamp connector disposed in a rearward end of said interior space and coupled to said socket member for receiving a terminal portion of an electrical component inserted into a forward end of said interior space to connect said electrical component electrically to a circuit; and
   opposed pairs of separated upper and lower locking tabs formed on one of said side walls of said socket member and said support base, and projecting outwardly therefrom, said upper and lower locking tabs connecting said socket member to said support base and positionally restraining said socket member within said open space, wherein
   said edge of said support base defines an enlarged forward space in which said electrical component is disposed, and a rearward space in which said socket member is disposed.

2. A connector as in claim 1, wherein said support base includes inwardly projecting retaining ears disposed at a juncture between said forward and rearward spaces.

3. A connector as in claim 1, wherein said socket member includes at least one lock boss formed on an interior surface thereof, and wherein said at least one clamp connector includes at least one aperture, said at least one lock boss being seated within said at least one aperture when said clamp connector is inserted into said socket member to thereby couple said socket member and said at least one clamp connector.

4. A connector as in claim 1, wherein said at least one clamp connector includes a terminal lug for connection to a power supply lead.

5. A connector as in claim 4, wherein said terminal lug is positioned laterally of said at least one clamp connector.

6. A connector as in claim 1, wherein said support base includes slits positioned adjacent to respective ones of said pairs of upper and lower locking tabs.

7. A connector as in claim 1, wherein said socket member includes at least one vent window.

8. A connector as in claim 1, wherein said clamp connector includes at least one longitudinally extending fib providing a vent space between said at least one clamp connector and an interior surface of said socket member.

9. A connector as in claim 1, wherein said upper and lower locking tabs are separated so as to capture a region of said support base edge therebetween, whereby said socket member is coupled to said support base.

10. A connector as in claim 1, wherein said upper and lower locking tabs include post members extending in opposite directions relative to one another, said upper and lower locking tabs engaging a portion of said upper and lower walls, respectively, of said socket member, whereby said socket member is coupled to said support base.

11. A connector as in claim 9 or 10, wherein at least one of said upper and lower locking tabs includes a ramp surface.

12. A connector as in claim 1, wherein said socket member includes a rearward tail portion having a widthwise dimension less than a forward head portion thereof such that said socket member is generally T-shaped.

13. A connector as in claim 1, wherein said side walls of said socket member includes paired interior and exterior side walls disposed substantially parallel to, but separated from, one another to establish a channel therebetween.

14. A connector as in claim 13, wherein said exterior side wall includes at least one window in communication with said established channel.

15. A connector as in claim 1, wherein said electrical component is selected from lamp bulbs and fuses.

16. A connector for an electrical component comprising:
   a support base which includes an edge defining an open space; and
   an electrically insulated socket member connected to said support base within said defined open space for holding and establishing electrical connection with the electrical component; wherein
   said socket member includes an opposed pair of side walls, an upper wall and a lower wall which collectively establish an open-ended interior space;
   at least one clamp connector disposed in a rearward end of said interior space and coupled to said socket member for receiving a terminal portion of an electrical component inserted into a forward end of said interior space to connect said electrical component electrically to a circuit; and
   opposed pairs of separated upper and lower locking tabs formed on one of said side walls of said socket member and said support base, and projecting outwardly therefrom, said upper and lower locking tabs connecting said socket member to said support base and positionally restraining said socket member within said open space, wherein
   said upper and lower locking tabs each include an inclined ramp surface to facilitate insertion of said socket member into said open space.

* * * * *